US012394474B2

(12) United States Patent
So

(10) Patent No.: US 12,394,474 B2
(45) Date of Patent: Aug. 19, 2025

(54) MEMORY DEVICE, ELECTRONIC DEVICE INCLUDING THE SAME, AND OPERATING METHOD OF ELECTRONIC DEVICE

(71) Applicant: Samsung Electronics Co., Ltd., Suwon-si (KR)

(72) Inventor: Byungwook So, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 244 days.

(21) Appl. No.: 18/127,980

(22) Filed: Mar. 29, 2023

(65) Prior Publication Data

US 2023/0386563 A1   Nov. 30, 2023

(30) Foreign Application Priority Data

May 25, 2022  (KR) .................. 10-2022-0064358
Jul. 28, 2022  (KR) .................. 10-2022-0094029

(51) Int. Cl.
*G11C 7/00*   (2006.01)
*G11C 11/4093*   (2006.01)
*G11C 11/4096*   (2006.01)
*G11C 11/4099*   (2006.01)

(52) U.S. Cl.
CPC ...... *G11C 11/4096* (2013.01); *G11C 11/4093* (2013.01); *G11C 11/4099* (2013.01)

(58) Field of Classification Search
CPC ....... G11C 7/1051; G11C 7/22; G11C 7/1072; G11C 7/1066
USPC ............. 365/189.15, 189.16, 189.14
See application file for complete search history.

(56) References Cited

U.S. PATENT DOCUMENTS

| 9,026,725 | B2 | 5/2015 | Kostinsky et al. |
| 9,207,949 | B2 | 12/2015 | Lee et al. |
| 10,176,858 | B1* | 1/2019 | Wilmoth ............... G11C 7/109 |
| 10,613,995 | B2 | 4/2020 | Yeung et al. |
| 2009/0300278 | A1 | 12/2009 | Kruger |
| 2011/0078370 | A1 | 3/2011 | Chaudhuri et al. |
| 2012/0201088 | A1 | 8/2012 | Rajan et al. |
| 2015/0113234 | A1* | 4/2015 | Morris ............... G06F 13/1689 |
| | | | 711/154 |
| 2019/0079699 | A1 | 3/2019 | Lee et al. |

(Continued)

FOREIGN PATENT DOCUMENTS

KR   10-2011-0010793 A   2/2011

OTHER PUBLICATIONS

Communication issued Oct. 20, 2023 by the European Patent Office in European Patent Application No. 23173279.3.

(Continued)

*Primary Examiner* — Son T Dinh
(74) *Attorney, Agent, or Firm* — Sughrue Mion, PLLC

(57) ABSTRACT

An operating method of an electronic device includes performing command bus training on a command/address line between a memory device and a system-on-chip (SoC), performing first read training based on a first pattern that is stored in a mode register included in the memory device, performing first write training based on a first write operation on a buffer included in the memory device, performing second read training based on a second pattern that is stored in a memory bank included in the memory device, and performing second write training based on a second write operation on the memory bank.

20 Claims, 10 Drawing Sheets

(56) References Cited

U.S. PATENT DOCUMENTS

2020/0202905 A1  6/2020  Hong et al.
2021/0349730 A1  11/2021 Lee et al.

OTHER PUBLICATIONS

Jedec: "DDR5 Full Spec Draft Rev.0.1", Dec. 5, 2017, XP055771628, Retrieved from the Internet: URL:jedec.org [retrieved on Feb. 3, 2021]. (321 pages total).

* cited by examiner

MEMORY DEVICE, ELECTRONIC DEVICE INCLUDING THE SAME, AND OPERATING METHOD OF ELECTRONIC DEVICE

CROSS-REFERENCE TO RELATED APPLICATIONS

This application is based on and claims priority under 35 U.S.C. § 119 to Korean Patent Application No. 10-2022-0064358, filed on May 25, 2022 and to Korean Patent Application No. 10-2022-0094029, filed on Jul. 28, 2022, in the Korean Intellectual Property Office, the disclosures of each of which being incorporated by reference herein in their entireties.

BACKGROUND

The present disclosure relates to an integrated circuit, and more particularly, to a memory device performing training and an operating method of an electronic device including the memory device.

A memory device and a system-on-chip (SoC) controlling the memory device may perform initialization or training to secure the reliability of data that is transmitted and/or received.

A memory device and an SoC may be connected to each other through a plurality of pins, and training with respect to data, which is transmitted and/or received through the pins, may be performed during initialization or a particular training operation.

Because a memory device and an SoC transmit and/or receive data based on training parameters obtained through training, it may be advantageous to obtain correct training parameters.

SUMMARY

It is an aspect to provide a memory device performing training, considering cell operation, and an operating method of an electronic device including the memory device.

According to an aspect of one or more embodiments, there is provided an operating method of an electronic device including a memory device and a system-on-chip (SoC) controlling the memory device. The operating method comprises performing command bus training on a command/address line between the memory device and the SoC, performing first read training based on a first pattern that is stored in a mode register included in the memory device, performing first write training based on a first write operation on a buffer included in the memory device, performing second read training based on a second pattern that is stored in a memory bank included in the memory device, and performing second write training based on a second write operation on the memory bank.

According to another aspect of one or more embodiments, there is provided an electronic device including an SoC including a memory controller and a first interface circuit and a memory device including a memory bank and a second interface circuit configured to exchange a signal with the first interface circuit and control the memory bank, the memory bank including a plurality of memory cells, wherein the first interface circuit and the second interface circuit are configured to perform first read training based on a read operation on the memory bank with respect to first read data and perform first write training based on write and read operations on the memory bank with respect to first write data.

According to a further aspect of one or more embodiments, there is provided an operating method of a memory device. The operating method includes receiving a first write command and first write data from a SoC through a command/address line and a data line, respectively, storing the first write data in a memory bank, receiving a first read command from the SoC, providing, to the SoC, the first write data that is stored in the memory bank, receiving first data signal voltage configuration information from the SoC, and adjusting a level of a reference voltage to a first level, based on the first data signal voltage configuration information, the reference voltage being used to capture data received through the data line.

BRIEF DESCRIPTION OF THE DRAWINGS

Various embodiments will be more clearly understood from the following detailed description taken in conjunction with the accompanying drawings, in which.

DETAILED DESCRIPTION

Hereinafter, various embodiments will be described with reference to the accompanying drawings. As used in this specification, the terms "first", "second", "third", and "fourth", etc. are used merely to distinguish elements from one another and do not denote any particular order unless an order is specifically described. For example, the term "second" may be used without using the term "first". Additionally, without loss of generality, a "first" element may be designated as a "second" element, and/or a "first" element may be designated as a "second" element, and so on.

Figure 1:
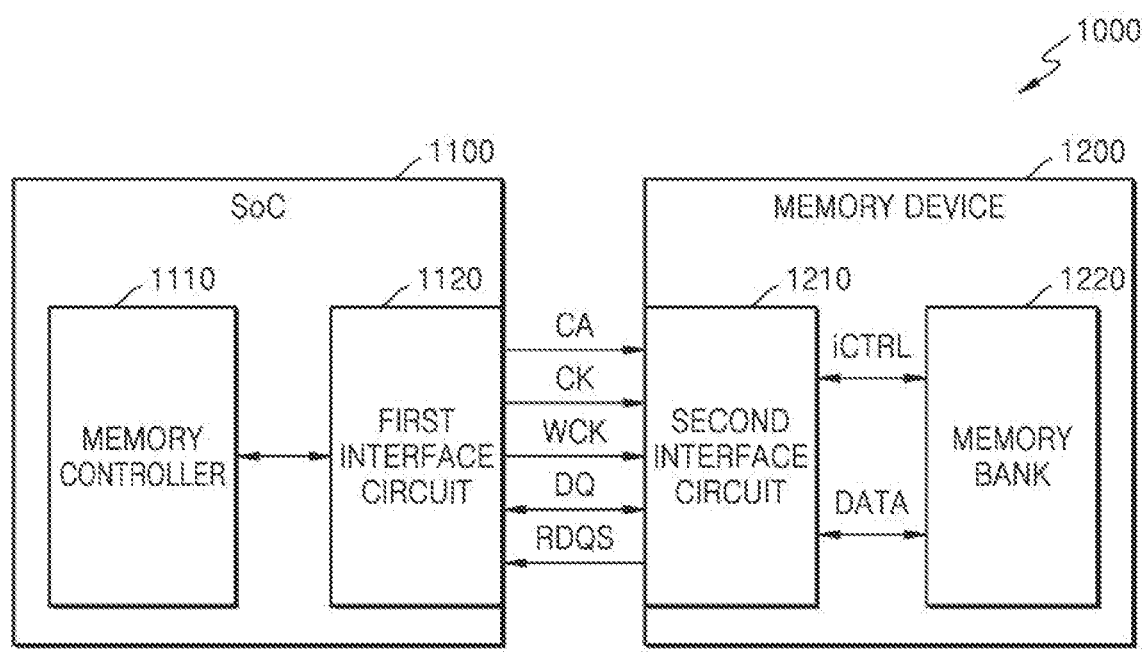
FIG. 1 is a block diagram illustrating an electronic device according to some embodiments.

FIG. 1 is a block diagram illustrating an electronic device 1000 according to some embodiments. Referring to FIG. 1, the electronic device 1000 may include a system-on-chip (SoC) 1100 and a memory device 1200. The electronic device 1000 may correspond to any one of various computing devices, such as a desktop computer, a laptop computer, a workstation, a server, a smartphone, a tablet personal computer (PC), a digital camera, or a black box.

The SoC 1100 may generally control operations of the electronic device 1000. For example, the SoC 1100 may correspond to an application processor (AP) configured to generally control operations of the electronic device 1000. The SoC 1100 may execute an operating system (OS), a program, or an application, which is run in the electronic device 1000. The SoC 1100 may include intellectual property (IP) blocks configured to control various operations of the electronic device 1000 or control various elements of the electronic device 1000.

The SoC 1100 may store data in the memory device 1200 or read data from the memory device 1200. For example, the SoC 1100 may include a memory controller 1110 and a first interface circuit 1120. The memory controller 1110 may be configured to control the memory device 1200 through the first interface circuit 1120. The first interface circuit 1120 may be referred to as a physical layer (PHY).

Under control by the memory controller 1110, the first interface circuit 1120 may transmit a clock signal CK, a write clock signal WCK, and a command/address signal CA to the memory device 1200, exchange a data signal DQ with the memory device 1200, and receive a read strobe signal RDQS from the memory device 1200. The first interface circuit 1120 may correspond to a double data rate (DDR)-PHY configured to support a DDR interface. In some embodiments, the first interface circuit 1120 may be configured to support various standard interfaces, such as DDR, graphics DDR (GDDR), and low-power DDR (LPDDR), defined by Joint Electron Device Engineering Council (JEDEC) standards, but the scope of the embodiments is not limited thereto.

The memory device 1200 may operate under control by the SoC 1100. For example, the memory device 1200 may receive the clock signal CK and the command/address signal CA from the SoC 1100 and, in response to the clock signal CK and the command/address signal CA, may transmit data to the SoC 1100 through the data signal DQ and the read strobe signal RDQS or receive data from the SoC 1100 through the data signal DQ and the write clock signal WCK. For example, the memory device 1200 may include a second interface circuit 1210 and a memory bank 1220. The second interface circuit 1210 may be referred to as a PHY. The second interface circuit 1210 may control a write operation, in which data is stored in the memory bank 1220, and a read operation, in which data is read from the memory bank 1220, based on an internal control signal iCTRL.

The memory device 1200 may correspond to a dynamic random access memory (DRAM) device, but the scope of the embodiments is not limited thereto. For example, the memory device 1200 may include at least one of various kinds of memory devices, such as a DRAM device, a static RAM (SRAM) device, a resistive RAM (RRAM) device, a ferroelectric RAM (FRAM) device, a phase-change RAM (PRAM) device, a magnetic RAM (MRAM) device, and/or a flash memory device.

Because the SoC 1100 and the memory device 1200 have different operating characteristics from each other, initialization or training may be required in the initial operation of the electronic device 1000 or the initial operation between the SoC 1100 and the memory device 1200.

Training may include training between the command/address signal CA and the clock signal CK (hereinafter, referred to as command bus training), training for adjusting the duty cycle of the clock signal CK (hereinafter, referred to as duty cycle calibration), training between the write clock signal WCK and the clock signal CK (hereinafter, referred to as WCK2CK leveling), training between the write clock signal WCK and read data (hereinafter, referred to as read training), and/or training between the write clock signal WCK and write data (hereinafter, referred to as write training). The training may further include training with respect to a read reference voltage for identifying read data, training with respect to a write reference voltage for identifying write data, and/or training with respect to a command/address reference voltage for identifying a command/address signal. In some embodiments, a training parameter (e.g., the input/output timings of signals or a reference voltage for identifying a signal) may be determined through training.

During initialization or training, the first interface circuit 1120 of the SoC 1100 may exchange signals for training with the second interface circuit 1210 of the memory device 1200.

After the initialization or the training, the second interface circuit 1210 may perform a cell operation based on the internal control signal iCTRL, wherein the cell operation includes a write operation, in which data DATA is stored in the memory bank 1220, and a read operation, in which the data DATA is read from the memory bank 1220. In the course of training during the cell operation, additional power consumption that has not been considered may occur. In other words, signal integrity and power integrity may degrade because of noise caused by the cell operation, and accordingly, an error may occur in data transmission between the SoC 1100 and the memory device 1200.

According to some embodiments, during training, a training parameter may be determined, preemptively considering noise caused by the cell operation. After the training, a cell operation is performed based on the training parameter, which has been determined considering the noise, and accordingly, reliable data may be exchanged between the SoC 1100 and the memory device 1200.

Figure 2:
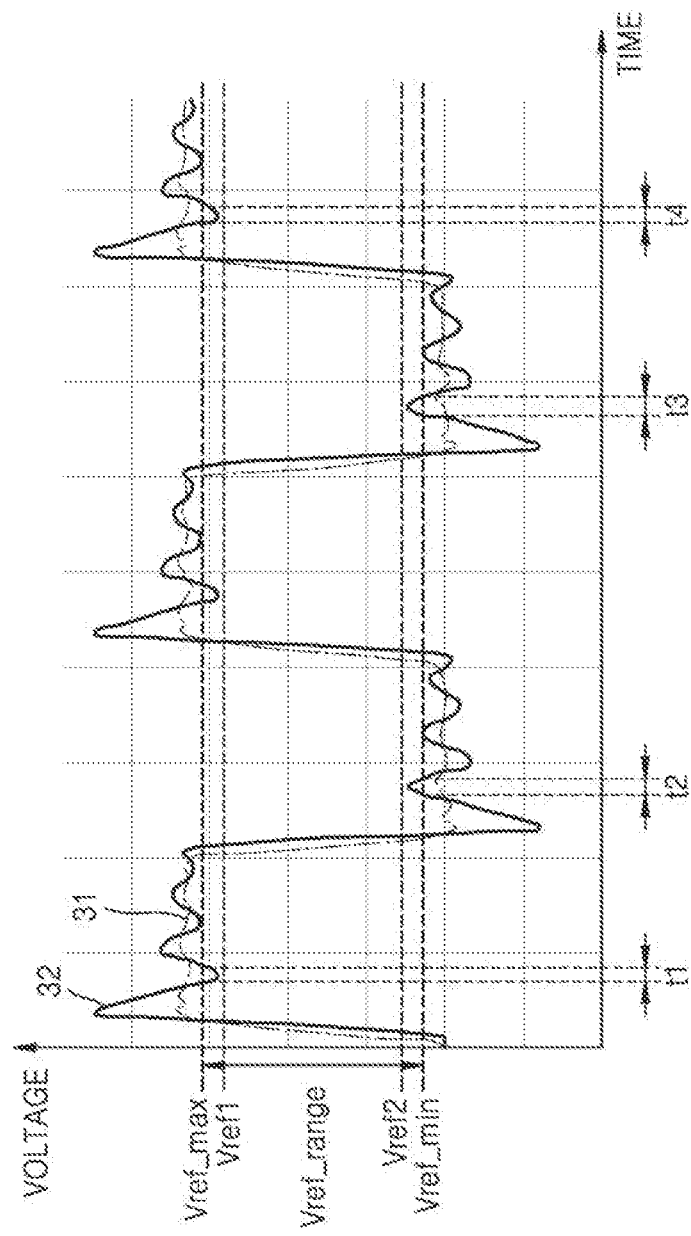
FIG. 2 is a waveform diagram of a first signal, which does not include noise caused by cell operation, and a second signal, which includes noise caused by cell operation.

FIG. 2 is a waveform diagram of a first signal, which does not include noise caused by a cell operation, and a second signal, which includes noise caused by the cell operation. FIG. 2 may be described with reference to FIG. 1.

Referring to FIG. 2, a first signal 31, which does not include noise caused by the cell operation, and a second signal 32, which includes noise caused by the cell operation, may correspond to at least one of the command/address signal CA, the clock signal CK, the write clock signal WCK, the data signal DQ, and/or the read strobe signal RDQS in FIG. 1.

The first signal 31 may be exchanged between the SoC 1100 and the memory device 1200 and may not include noise caused by cell operation. The first signal 31 may have a relatively smooth waveform. Accordingly, the first signal 31 is compared with a reference voltage in a reference voltage range Vref_range, and therefore, reliable data may be obtained. The reference voltage range Vref_range may refer to the range between a minimum reference voltage Vref_min and a maximum reference voltage Vref_max. When the level of the first signal 31 is higher than the level of a reference voltage, the first signal 31 may be identified as "1". When the level of the first signal 31 is lower than the level of the reference voltage, the first signal 31 may be identified as "0".

The second signal 32 may be exchanged between the SoC 1100 and the memory device 1200 and may include noise caused by the cell operation. The second signal 32 may have a relatively irregular waveform as compared with the first signal 31. Accordingly, referring to FIG. 2, when the second signal 32 is compared with a voltage (e.g., a voltage between the maximum reference voltage Vref_max and a first reference voltage Vref1 or a voltage between the minimum reference voltage Vref_min and a second reference voltage Vref2), which is close to either of the opposite ends of the reference voltage range Vref_range, data having a relatively low reliability may be obtained.

For example, when a reference voltage is between the maximum reference voltage Vref_max and the first reference voltage Vref1, the second signal 32 may be identified as "0" in a first time period t1 and a fourth time period t4 even though the second signal 32 is actually "1".

As another example, when a reference voltage is between the minimum reference voltage Vref_min and the second reference voltage Vref2, the second signal 32 may be identified as "1" in a second time period t2 and a third time period t3 even though the second signal 32 is actually "0".

In other words, when a reference voltage is set to be close either of the opposite ends of the reference voltage range Vref_range because of training performed without considering cell operation, the reliability of data may degrade.

Although it has been described in the examples that training with respect to a reference voltage is not appropriately performed, the slew rate of a signal may also be influenced because there is additional power consumption during the cell operation. When training with respect to input/output timings of signals (e.g., training between the write clock signal WCK and the data signal DQ) is completed without considering cell operation, the reliability of data transmitted by the signals may degrade.

According to some embodiments, the electronic device 1000 performs second training in consideration of a cell operation such that reliable data may be exchanged between the SoC 1100 and the memory device 1200

Figure 3:
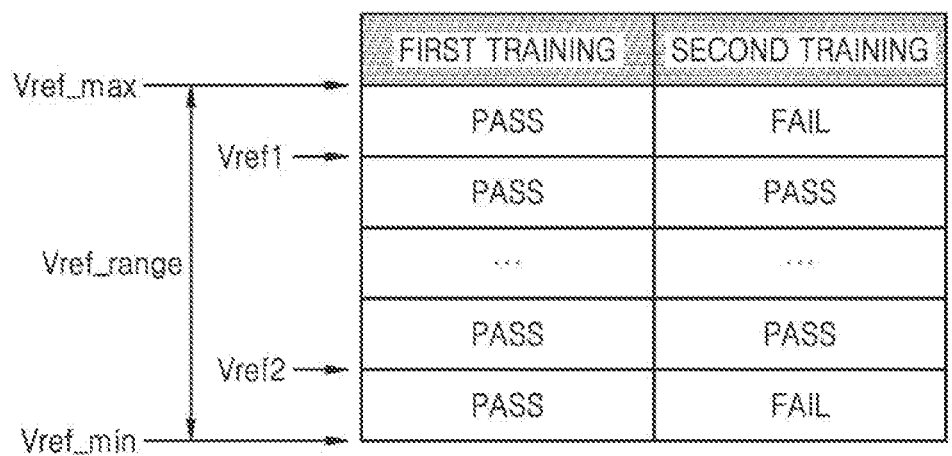
FIG. 3 is a diagram showing a comparison of a logic level of an actual signal with a logic level detected based on a reference voltage.

FIG. 3 is a diagram showing a comparison of a logic level of an actual signal with a logic level detected based on a reference voltage. FIG. 3 may be described with reference to FIGS. 1 and 2.

Referring to FIG. 3, when the logic level of an actual signal is the same as a logic level, which is identified by comparing the actual signal with a reference voltage, PASS may appear. When the logic level of an actual signal is different from a logic level, which is identified by comparing the actual signal with a reference voltage, FAIL may appear.

First training may correspond to a training operation without consideration of a cell operation, and second training may correspond to a training operation considering the cell operation.

During the first training, data exchanged between the SoC 1100 and the memory bank 1220 may neither be stored in the memory bank 1220 nor be read from the memory bank 1220. In other words, because training with respect to the first signal 31 not including noise caused by a cell operation is performed during the first training, a result of comparing a reference voltage in the reference voltage range Vref_range with the first signal 31 may appear as PASS. Accordingly, the reference voltage may be set between the maximum reference voltage Vref_max and the minimum reference voltage Vref_min through the first training.

During the second training, data exchanged between the SoC 1100 and the memory device 1200 may be stored in the memory bank 1220 or may include data read from the memory bank 1220. In other words, because training with respect to the second signal 32 including noise caused by the cell operation is performed during the second training, a result of comparing a reference voltage between the maximum reference voltage Vref_max and the first reference voltage Vref1 with the second signal 32 may appear as FAIL, and a result of comparing a reference voltage between the minimum reference voltage Vref_min and the second reference voltage Vref2 with the second signal 32 may appear as FAIL.

A result of comparing a reference voltage between the first reference voltage Vref1 and the second reference voltage Vref2 with the second signal 32 may appear as PASS. Accordingly, the reference voltage may be set in a reference voltage range between the first reference voltage Vref1 and the second reference voltage Vref2 through the second training. The reference voltage range Vref_range may be larger than the reference voltage range between the first reference voltage Vref1 and the second reference voltage Vref2.

A cell operation between the SoC 1100 and the memory device 1200 is performed in a normal operation after training, and therefore, data reliability may increase due to the reference voltage set through the second training, according to some embodiments.

Figure 4:
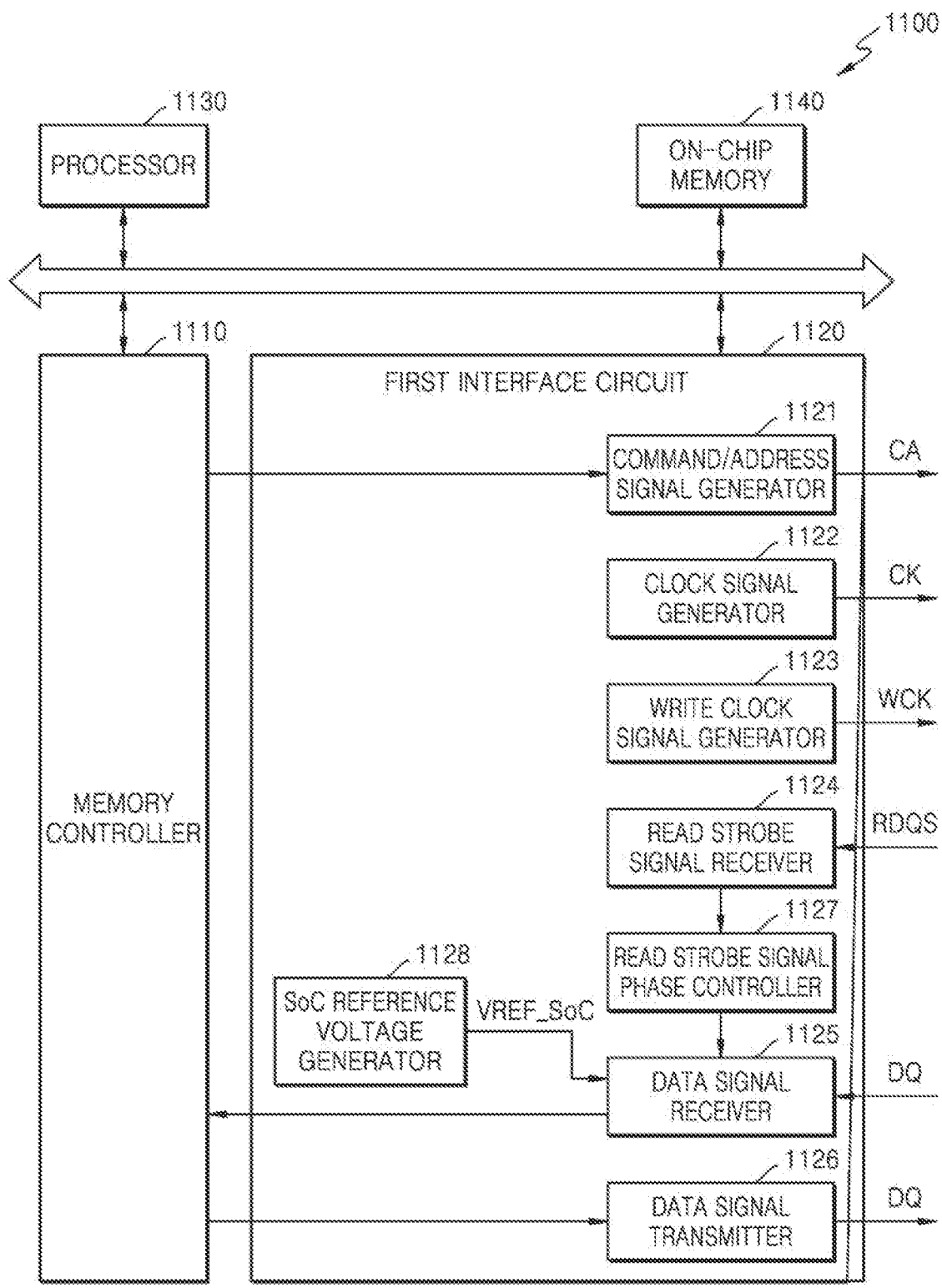
FIG. 4 is a block diagram illustrating a system-on-chip (SoC) of the electronic device of FIG. 1, according to some embodiments.

FIG. 4 is a block diagram illustrating the SoC 1100 in FIG. 1, according to some embodiments. Referring to FIGS. 1 and 4, the SoC 1100 may include the memory controller 1110, the first interface circuit 1120, a processor 1130, and an on-chip memory 1140.

The memory controller 1110 may communicate with the memory device 1200 through the first interface circuit 1120. The memory controller 1110 may be configured to control the memory device 1200 under control by the processor 1130. Although not shown, the memory controller 1110 may include various elements, such as a command queue, a command scheduler, and a data queue, to control the memory device 1200.

The first interface circuit 1120 may support a PHY for communication between the memory controller 1110 and the memory device 1200.

The first interface circuit 1120 may include a command/address signal generator 1121, a clock signal generator 1122, a write clock signal generator 1123, a read strobe signal receiver 1124, a data signal receiver 1125, a data signal transmitter 1126, a read strobe signal phase controller 1127, and an SoC reference voltage generator 1128.

The command/address signal generator 1121 may generate the command/address signal CA to be transmitted to the memory device 1200, under control by the memory controller 1110. The command/address signal CA may be provided to the memory device 1200 through command and address lines. The clock signal generator 1122 may generate the clock signal CK to be provided to the memory device 1200. The clock signal CK may be provided to the memory device 1200. For example, the memory device 1200 may capture the command/address signal CA, based on the clock signal CK provided from the SoC 1100. The write clock signal generator 1123 may generate the write clock signal WCK to be provided to the memory device 1200. The write clock signal WCK may be provided to the memory device 1200 through a write clock line. For example, the memory device 1200 may capture the data signal DQ, based on the write clock signal WCK provided from the SoC 1100. The read strobe signal receiver 1124 may receive the read strobe signal RDQS from the memory device 1200. The read strobe signal RDQS may be a clock signal used to capture the data signal DQ received from the memory device 1200. The read strobe signal phase controller 1127 may control the phase of the read strobe signal RDQS.

Hereinafter, for conciseness of the drawings and convenience of description, the terms "command/address signal"

and "data signal" are used and may respectively indicate a command/address line and a data line between the SoC 1100 and the memory device 1200 or signals transmitted through corresponding lines.

The data signal receiver 1125 may receive the data signal DQ from the memory device 1200 and the read strobe signal RDQS from the read strobe signal phase controller 1127. The data signal receiver 1125 may be configured to capture the data signal DQ at a rising or falling edge of the read strobe signal RDQS. The data signal receiver 1125 may be configured to capture the data signal DQ based on an SoC reference voltage VREF_SoC and output received data. For example, the data signal receiver 1125 may determine received data to be "1" when the level of the data signal DQ is higher than the SoC reference voltage VREF_SoC at a rising or falling edge of the read strobe signal RDQS and to be "0" when the level of the data signal DQ is lower than the SoC reference voltage VREF_SoC at a rising or falling edge of the read strobe signal RDQS. In other words, the SoC reference voltage VREF_SoC may be used by the SoC 1100 to capture a signal, which is received through the data signal DQ and the read strobe signal RDQS. The received data output from the data signal receiver 1125 may be provided to the memory controller 1110.

The data signal transmitter 1126 may output transmission data, which is provided from the memory controller 1110, through the data signal DQ.

The SoC reference voltage generator 1128 may generate the SoC reference voltage VREF_SoC, which is used by the data signal receiver 1125. For example, the SoC reference voltage generator 1128 may generate the SoC reference voltage VREF_SoC, based on code representing a voltage level.

The processor 1130 may generally control operations of the SoC 1100. The processor 1130 may execute various kinds of software (e.g., application programs, OSs, file systems, and device drivers), which are stored in or loaded to the on-chip memory 1140. The processor 1130 may include homogeneous multi-core processors or heterogeneous multi-core processors. For example, the processor 1130 may include at least one of various kinds of data processing units, such as a central processing unit (CPU), an image signal processing unit (ISP), a digital signal processing unit (DSP), a graphics processing unit (GPU), a vision processing unit (VPU), and a neural processing unit (NPU).

The on-chip memory 1140 may include various kinds of elements, such as an application program, an operating system (OS), a file system, and a device driver, which are used for the electronic device 1000 to operate. The elements of the on-chip memory 1140 may be provided as software or firmware and driven by the processor 1130. The on-chip memory 1140 may include initialization program code. The initialization program code may include program instructions for performing the initialization of the SoC 1100, which is described below. In other words, when the processor 1130 executes the initialization program code included in the on-chip memory 1140, the initialization of the SoC 1100, which is described below according to various embodiments, may be performed. However, the scope of the embodiments is not limited thereto, and in some embodiments, the initialization of the SoC 1100 may be performed by a separate control circuit or training circuit, which is implemented by hardware.

Figure 5:
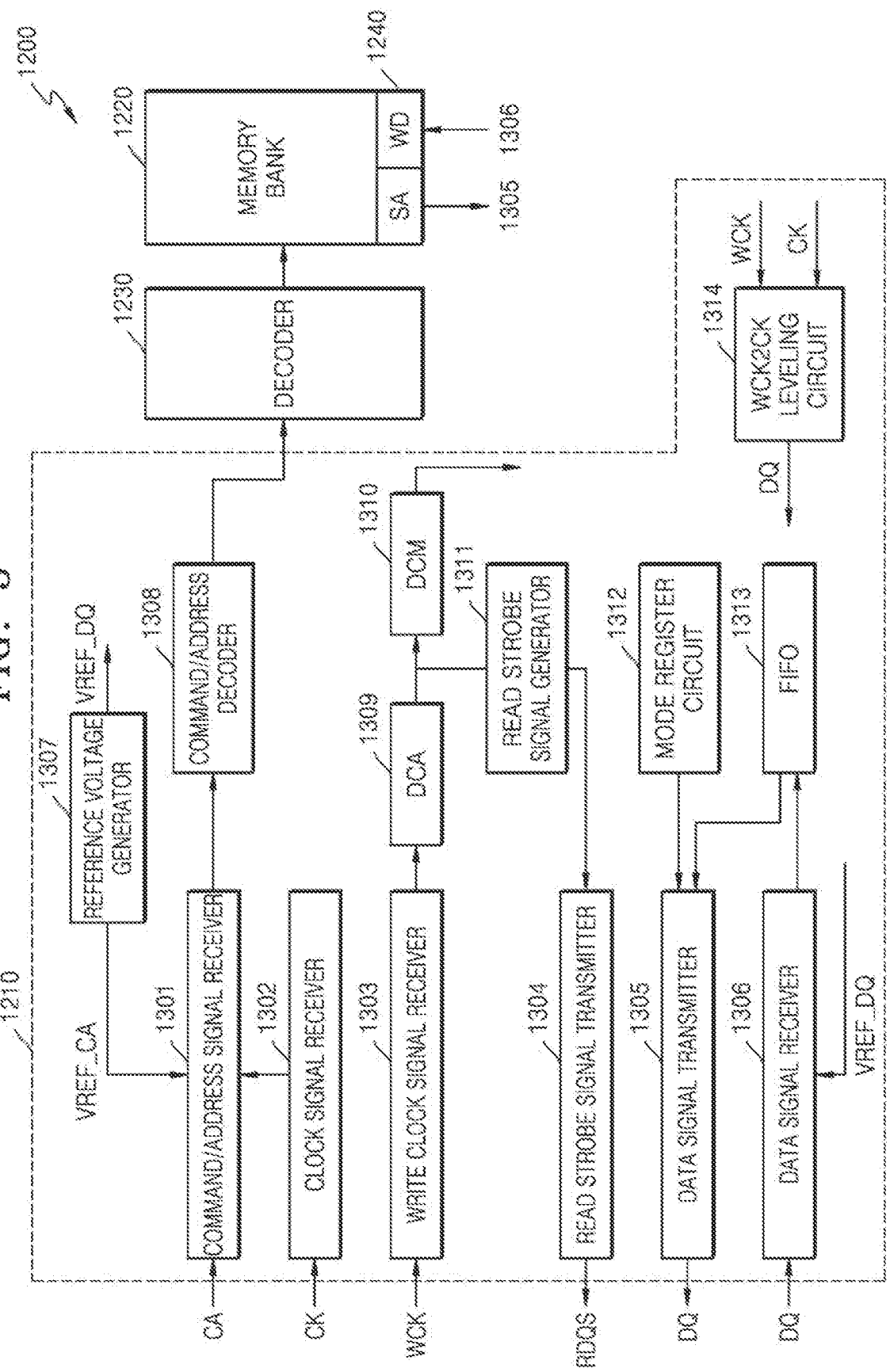
FIG. 5 is a block diagram illustrating a memory device of the electronic device of FIG. 1, according to some embodiments.

FIG. 5 is a block diagram illustrating the memory device 1200 in FIG. 1, according to some embodiments. Referring to FIGS. 1 and 5, the memory device 1200 may include the second interface circuit 1210, the memory bank 1220, a decoder 1230, and a write driver and sense amplifier 1240.

The second interface circuit 1210 may include a command/address signal receiver 1301, a clock signal receiver 1302, a write clock signal receiver 1303, a read strobe signal transmitter 1304, a data signal transmitter 1305, a data signal receiver 1306, a reference voltage generator 1307, a command/address decoder 1308, a duty cycle adjustor (DCA) 1309, a duty cycle monitor (DCM) 1310, a read strobe signal generator 1311, a mode register circuit 1312, a first in first out (FIFO) 1313, and a WCK2CK leveling circuit 1314.

The command/address signal receiver 1301 may receive the command/address signal CA from the SoC 1100. The clock signal receiver 1302 may receive the clock signal CK from the SoC 1100. The write clock signal receiver 1303 may receive the write clock signal WCK from the SoC 1100. The read strobe signal transmitter 1304 may provide the read strobe signal RDQS to the SoC 1100. The data signal transmitter 1305 may provide the data signal DQ to the SoC 1100 by capturing the data signal DQ in synchronization with a rising or falling edge of the read strobe signal RDQS. The data signal receiver 1306 may capture the data signal DQ, which is received from the SoC 1100, in synchronization with a rising or falling edge of the read clock signal WCK.

The reference voltage generator 1307 may generate reference voltages, e.g., a command/address signal reference voltage VREF_CA and a data signal reference voltage VREF_DQ, which are used in the memory device 1200. For example, the reference voltage generator 1307 may generate the command/address signal reference voltage VREF_CA based on configuration information of the mode register circuit 1312. The command/address signal receiver 1301 may capture the command/address signal CA based on the command/address signal reference voltage VREF_CA.

The reference voltage generator 1307 may generate the data signal reference voltage VREF_DQ based on the configuration information of the mode register circuit 1312. The data signal receiver 1306 may capture the data signal DQ, which is received from the SoC 1100, based on the data signal reference voltage VREF_DQ.

The DCA 1309 may adjust the duty cycle of the write clock signal WCK. In detail, the DCA 1309 may adjust the duty cycle of the write clock signal WCK, based on duty cycle information (e.g., DCA code), which is stored in the mode register circuit 1312. The DCM 1310 may monitor the duty cycle of the write clock signal WCK. In detail, the DCM 1310 may store, in the mode register circuit 1312, whether the duty cycle of the write clock signal WCK exceeds or below 50%.

The read strobe signal generator 1311 may generate the read strobe signal RDQS based on the write clock signal WCK. The read strobe signal RDQS may be output to the SoC 1100 through the read strobe signal transmitter 1304.

The mode register circuit 1312 may store various kinds of information, which are used for the operations of the memory device 1200. For example, the mode register circuit 1312 may include a plurality of mode registers. The mode register circuit 1312 may store configuration information regarding training. The elements of the SoC 1100 and the memory device 1200 may perform training by writing configuration information to the mode register circuit 1312 or reading configuration information from the mode register circuit 1312. For example, during first read training, a pattern stored in the mode register circuit 1312 may be output to the SoC 1100 through the data signal transmitter 1305. The SoC 1100 may adjust a read training parameter based on the pattern. For example, the SoC 1100 may adjust the phase of the read strobe signal RDQS or the level of the SoC reference voltage VREF_SoC.

During first write training, the FIFO 1313 may store write data, which is received from the SoC 1100 through the data signal receiver 1306, and provide the write data to the SoC 1100 through the data signal transmitter 1305. The SoC 1100 may compare the received write data with original write data and adjust the phase of the data signal DQ, which is output to the memory device 1200. The memory device 1200 may adjust the capture timing of write data, which is received through the data signal receiver 1306, by adjusting the phase of the write clock signal WCK.

The WCK2CK leveling circuit 1314 may detect a phase difference (or delay) between the write clock signal WCK and the clock signal CK and provide the phase difference therebetween to the SoC 1100 through the data signal DQ. The SoC 1100 may adjust the phase of the write clock signal WCK or the phase of the clock signal CK, based on the phase difference between the write clock signal WCK and the clock signal CK.

The decoder 1230 may decode a row address and a column address. The decoder 1230 may select or activate at least one word line corresponding to the row address. The decoder 1230 may select or activate at least one bit line corresponding to the column address.

The memory bank 1220 may include a plurality of memory cells connected to word lines and bit lines. Each of the memory cells may be configured to store data under control by a write driver WD or output data under control by a sense amplifier SA. The write driver WD and the sense amplifier SA may be connected to the bit lines of the memory bank 1220. The write driver WD may transmit data to memory cells through a bit line, and the sense amplifier SA may sense data from memory cells through a bit line.

According to some embodiments, during second read training, data stored in the memory bank 1220 may be provided to the SoC 1100 through the data signal transmitter 1305. When data is read from the memory bank 1220, signal stability decreases because of additional power consumption as compared with reading from the mode register circuit 1312 in the first read training, and accordingly, a read parameter with respect to the second read training may be different from a read parameter with respect to the first read training.

According to some embodiments, during second write training, write data may be stored in the memory bank 1220, then read from the memory bank 1220, and then provided to the SoC 1100 through the data signal transmitter 1305. When write and read operations are performed on the memory bank 1220, signal stability decreases because of additional power consumption as compared with reading and writing from the FIFO 1313 in the first write training, and accordingly, a write parameter with respect to the second write training may be different from a write parameter with respect to the first write training.

Figure 6:
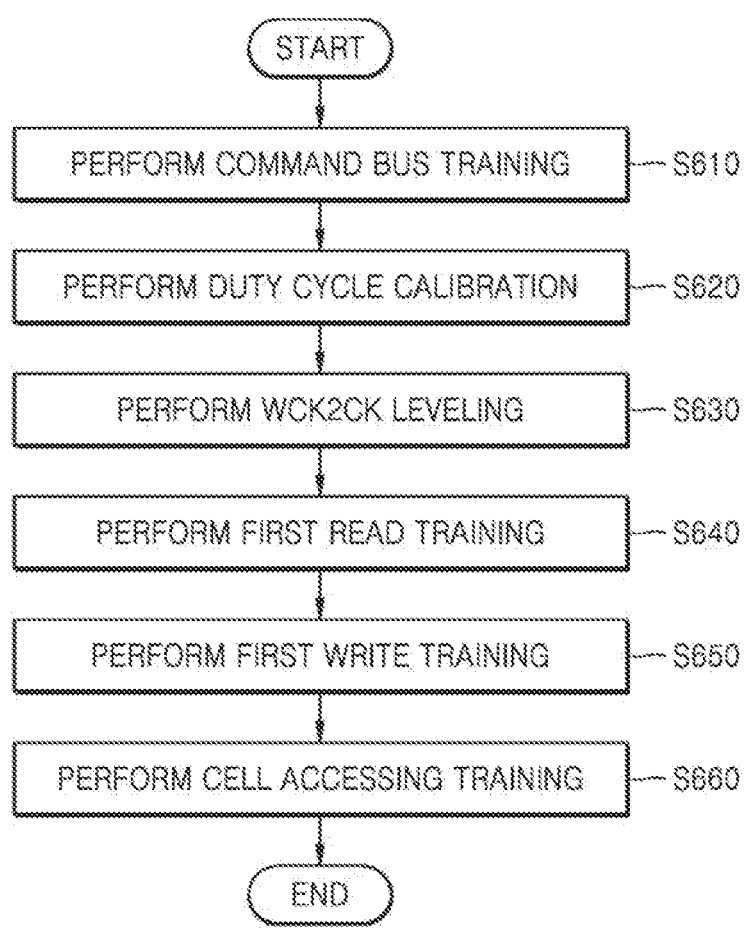
FIG. 6 is a flowchart of a training sequence according to some embodiments.

FIG. 6 is a flowchart of a training sequence according to some embodiments.

FIG. 6 may be described with reference to FIGS. 1, 4, and 5.

The SoC 1100 and the memory device 1200 may perform a plurality of training operations S610 to S660 during initialization or training.

The SoC 1100 and the memory device 1200 may perform command bus training in operation S610. During the command bus training, training may be performed based on whether the command/address signal CA output from the SoC 1100 is correctly captured by the memory device 1200 according to the clock signal CK. In detail, the SoC 1100 may provide a CBT pattern to the memory device 1200 through the command/address signal CA. The memory device 1200 may capture the command/address signal CA, based on the clock signal CK, and transmit captured data to the SoC 1100 through the data signal DQ. The SoC 1100 may compare the captured data with the original CBT pattern. Based on a result of the comparison, the SoC 1100 may adjust the phase difference (or delay) between the command/address signal CA and the clock signal CK. Based on a result of the comparison, the SoC 1100 may provide configuration information of the command/address signal reference voltage VREF_CA to the memory device 1200. The memory device 1200 may adjust the command/address signal reference voltage VREF_CA, based on the configuration information.

The SoC 1100 and the memory device 1200 may perform duty cycle calibration in operation S620. In detail, the DCM 1310 of the memory device 1200 may monitor the duty cycle of the write clock signal WCK received from the SoC 1100. The DCM 1310 may store information about the duty cycle of the write clock signal WCK in a mode register of the second interface circuit 1210. The DCA 1309 of the memory device 1200 may adjust the duty cycle of the write clock signal WCK received from the SoC 1100.

The SoC 1100 and the memory device 1200 may perform WCK2CK leveling, thereby adjusting the phase difference between the write clock signal WCK and the clock signal CK, in operation S630. The WCK2CK leveling circuit 1314 of the memory device 1200 may compare the respective phases of the write clock signal WCK and the clock signal CK, which are received from the SoC 1100, with each other and provide a phase comparison result to the SoC 1100. The SoC 1100 may adjust the phase of the write clock signal WCK or the clock signal CK, based on the phase comparison result. The WCK2CK leveling may be referred to as write leveling. The write clock signal WCK may be referred to as a data strobe signal. Although it is illustrated in FIG. 6 that the WCK2CK leveling is performed after the duty cycle calibration, embodiments are not limited thereto. The WCK2CK leveling may be performed before the duty cycle calibration.

The SoC 1100 and the memory device 1200 may perform first read training in operation S640. The SoC 1100 may provide, to the memory device 1200, a command (e.g., a read DQ command (RDC)) instructing to perform first read training. In response to the command, the memory device 1200 may provide a pattern stored in a mode register thereof to the SoC 1100 through the data signal DQ. In some embodiments, the memory device 1200 may provide the read strobe signal RDQS to the SoC 1100. The SoC 1100 may obtain the pattern by capturing the data signal DQ according to the read strobe signal RDQS. The SoC 1100 may compare the obtained pattern with a reference pattern and identify whether correct data has been received. Based on a result of the comparison, the SoC 1100 may adjust the SoC reference voltage VREF_SoC. Based on the result of the comparison, the SoC 1100 may adjust the phase difference between the data signal DQ that has been received and the read strobe signal RDQS.

The SoC 1100 and the memory device 1200 may perform first write training in operation S650. The SoC 1100 may provide, to the memory device 1200, a command (e.g., a write FIFO command) instructing to perform the first write training, write data, and the write clock signal WCK. The write data may be provided to the memory device 1200 through the data signal DQ. In response to the command, the memory device 1200 may store the write data in the FIFO 1313 of the second interface circuit 1210. The SoC 1100 may provide, to the memory device 1200, a command (e.g., a read FIFO command) instructing to read the write data. In response to the command, the memory device 1200 may provide, to the SoC 1100, the write data stored in the FIFO 1313. The SoC 1100 may compare the original write data with the write data received from the memory device 1200. Based on a result of the comparison, the SoC 1100 may adjust the phase difference (or delay) between the write clock signal WCK and the write data transmitted through the data signal DQ. For example, the phase difference between the write data and the write clock signal WCK may be referred to as tWCK2DQI. Based on the result of the comparison, the SoC 1100 may provide configuration information of the data signal reference voltage VREF_DQ to the memory device 1200. The memory device 1200 may adjust the data signal reference voltage VREF_DQ, based on the configuration information.

According to some embodiments, the SoC 1100 and the memory device 1200 may perform cell accessing training in operation S660. In other words, the SoC 1100 and the memory device 1200 may perform second read training and/or second write training, based on a cell operation.

Unlike the first read training, during the second read training, a pattern stored in the memory bank 1220 may be provided to the SoC 1100. In detail, the SoC 1100 may provide, to the memory device 1200, a command instructing to perform the second read training. In response to the command, the memory device 1200 may provide, to the SoC 1100, the pattern stored in the memory bank 1220. In some embodiments, the memory device 1200 may store the pattern, which has been stored in the mode register circuit 1312, in the memory bank 1220 before receiving the command instructing to perform the second read training. The memory device 1200 may provide the pattern read from the memory bank 1220 to the SoC 1100 through the data signal DQ. In some embodiments, the memory device 1200 may provide the read strobe signal RDQS to the SoC 1100. The SoC 1100 may obtain the pattern by capturing the data signal DQ according to the read strobe signal RDQS. The SoC 1100 may compare the obtained pattern with the reference pattern and identify whether correct data has been received. Based on a result of the comparison, the SoC 1100 may adjust the SoC reference voltage VREF_SoC. The SoC reference voltage VREF_SoC resulting from the adjustment during the second read training may be different from the SoC reference voltage VREF_SoC resulting from the adjustment during the first read training. Based on the result of the comparison, the SoC 1100 may adjust the phase difference between the read strobe signal RDQS and the data signal DQ that has been received. The phase difference between the read strobe signal RDQS and the data signal DQ, which results from the adjustment during the second read training, may be different from the phase difference between the read strobe signal RDQS and the data signal DQ, which results from the adjustment during the first read training.

Unlike the first write training, during the second write training, write data may be stored in the memory bank 1220. In detail, the SoC 1100 may provide, to the memory device 1200, a command instructing to perform the second write training, the write data, and the write clock signal WCK. The write data may be provided to the memory device 1200 through the data signal DQ. In response to the command, the memory device 1200 may store the write data in the memory bank 1220. The SoC 1100 may provide, to the memory device 1200, a command instructing to read the write data. In response to the command, the memory device 1200 may provide the write data stored in the memory bank 1220 to the SoC 1100. The SoC 1100 may compare the original write data with the write data received from the memory device 1200. Based on a result of the comparison, the SoC 1100 may adjust the phase difference (or delay) between the write clock signal WCK and the write data transmitted through the data signal DQ. For example, the phase difference between the write data and the write clock signal WCK may be referred to as tWCK2DQI. The phase difference between the write data and the write clock signal WCK, which results from the adjustment during the second write training, may be different from the phase difference between the write data and the write clock signal WCK, which results from the adjustment during the first write training. Based on the result of the comparison, the SoC 1100 may provide configuration information of the data signal reference voltage VREF_DQ to the memory device 1200. The memory device 1200 may adjust the data signal reference voltage VREF_DQ, based on the configuration information. The data signal reference voltage VREF_DQ resulting from the adjustment during the second write training may be different from the data signal reference voltage VREF_DQ resulting from the adjustment during the first write training.

Although it is illustrated in FIG. 6 that the cell accessing training (S660) is performed after the first read training (S640) and the first write training (S650), embodiments are not limited thereto. In some embodiments, the first read training (S640) and the first write training (S650) may be omitted.

According to some embodiments, because a read parameter and a write parameter are determined considering noise caused by a cell operation, the SoC 1100 and the memory device 1200 may perform write and read operations with improved reliability.

Figure 7:
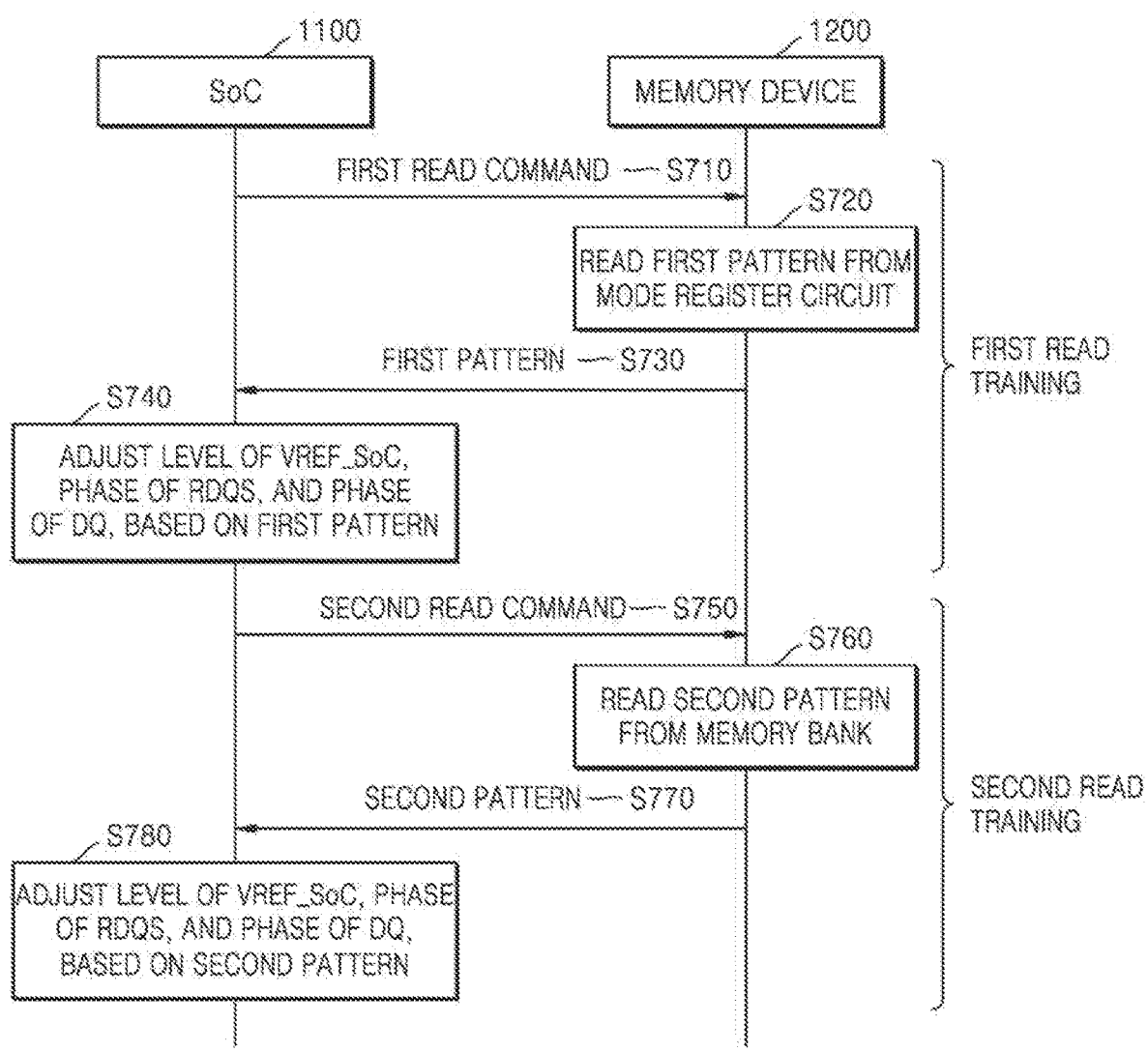
FIG. 7 is a diagram for describing a read training method according to some embodiments.

FIG. 7 is a diagram for describing a read training method according to some embodiments. FIG. 7 may be described with reference to FIGS. 4 and 5.

Referring to FIG. 7, the SoC 1100 and the memory device 1200 may perform read training. The read training method may include a first read training method and a second read training method.

The first read training method may include operations S710 to S740.

The SoC 1100 may provide a first read command to the memory device 1200 in operation S710. The first read command may instruct to read a pattern from the mode register circuit 1312. The first read command may be referred to as a read DQ calibration (RDC) command.

The memory device 1200 may read a first pattern that has been stored in the mode register circuit 1312 in operation S720. In detail, the first pattern of the mode register circuit 1312 may be transmitted to the data signal transmitter 1305.

The memory device 1200 may provide the first pattern to the SoC 1100 in operation S730. In detail, the first pattern may be transmitted from the data signal transmitter 1305 to the data signal receiver 1125 of the first interface circuit 1120.

The SoC 1100 may adjust the level of the SoC reference voltage VREF_SoC and the respective phases of the read strobe signal RDQS and the data signal DQ, based on the first pattern, in operation S740. In some embodiments, the SoC 1100 may compare the first pattern with a reference pattern. The SoC 1100 may adjust the level of the SoC reference voltage VREF_SoC to a first level according to a result of the comparison. According to the result of the comparison, the SoC 1100 may adjust the phase of the read strobe signal RDQS to a first phase value. According to the result of the comparison, the SoC 1100 may adjust the phase of the data signal DQ to a second phase value. In some embodiments, the SoC 1100 may receive the first pattern through a plurality of data pins. The SoC 1100 may compare pieces of data, which are received through the data pins, with each other. Based on a result of the comparison, the SoC 1100 may adjust the level of the SoC reference voltage VREF_SoC and the respective phases of the read strobe signal RDQS and the data signal DQ.

The second read training method may include operations S750 to S780.

The SoC 1100 may provide a second read command to the memory device 1200 in operation S750. The second read command may instruct to read a pattern from the memory bank 1220. In some embodiments, the pattern that is stored in the mode register circuit 1312 may be written to the memory bank 1220 before operation S750.

The memory device 1200 may read a second pattern that has been stored in the memory bank 1220 in operation S760. In detail, the second pattern of the memory bank 1220 may be transmitted to the data signal transmitter 1305.

The memory device 1200 may provide the second pattern to the SoC 1100 in operation S770. In detail, the second pattern may be transmitted from the data signal transmitter 1305 to the data signal receiver 1125 of the first interface circuit 1120.

The SoC 1100 may adjust the level of the SoC reference voltage VREF_SoC and the respective phases of the read strobe signal RDQS and the data signal DQ, based on the second pattern, in operation S780. In detail, the SoC 1100 may compare the second pattern with the reference pattern and adjust the level of the SoC reference voltage VREF_SoC to a second level according to a result of the comparison. According to the result of the comparison, the SoC 1100 may adjust the phase of the read strobe signal RDQS to a third phase value. According to the result of the comparison, the SoC 1100 may adjust the phase of the data signal DQ to a fourth phase value.

The first level may be different from the second level, the first phase value may be different from the third phase value, and the second phase value may be different from the fourth phase value.

Figure 8:
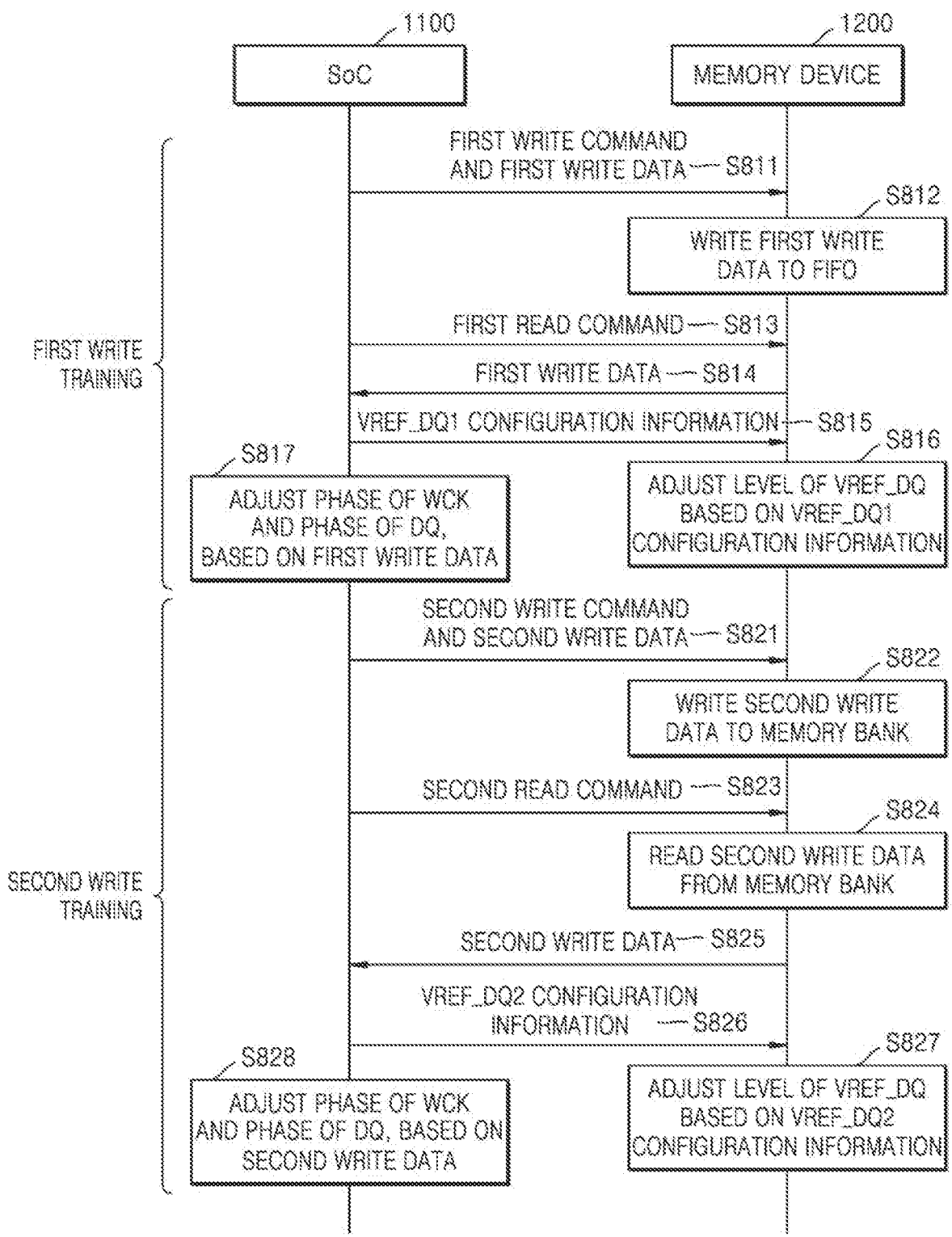
FIG. 8 is a diagram for describing a write training method according to some embodiments.

FIG. 8 is a diagram for describing a write training method according to some embodiments. FIG. 8 may be described with reference to FIGS. 4 and 5.

Referring to FIG. 8, the SoC 1100 and the memory device 1200 may perform write training. The write training method may include a first write training method and a second write training method.

The first write training method may include operations S811 to S817.

The SoC 1100 may provide a first write command and first write data to the memory device 1200 in operation S811. The first write command may instruct to write the first write data to the FIFO 1313. The first write command may be referred to as a write FIFO command.

The memory device 1200 may write the first write data to the FIFO 1313 in operation S812. In detail, the memory device 1200 may write the first write data to the FIFO 1313 in synchronization with activation timings of the write clock signal WCK.

The SoC 1100 may provide a first read command to the memory device 1200 in operation S813. The first read command may instruct to read data from the FIFO 1313. The first read command may be referred to as a read FIFO command.

The memory device 1200 may provide the first write data from the FIFO 1313 to the SoC 1100 in operation S814.

The SoC 1100 may provide, to the memory device 1200, first data signal reference voltage (VREF_DQ1) configuration information, which is calculated based on the first write data that has been read, in operation S815.

The memory device 1200 may adjust the level of the data signal reference voltage VREF_DQ, based on the VREF_DQ1 configuration information, in operation S816. For example, the memory device 1200 may adjust the level of the data signal reference voltage VREF_DQ to a first level.

The SoC 1100 may adjust the phase of the write clock signal WCK and the phase of the data signal DQ, based on the first write data, in operation S817. In detail, the SoC 1100 may compare the first write data with the original first write data and adjust the phase difference between the write clock signal WCK and the data signal DQ, based on a result of the comparison. For example, the SoC 1100 may adjust the phase difference between the write clock signal WCK and the data signal DQ to a first phase value.

The second write training method may include operations S821 to S827.

The SoC 1100 may provide a second write command and second write data to the memory device 1200 in operation S821. The second write command may instruct to write the second write data to the memory bank 1220.

The memory device 1200 may write the second write data to the memory bank 1220 in operation S822. In detail, the memory device 1200 may write the second write data to the memory bank 1220 through the write driver WD.

The SoC 1100 may provide a second read command to the memory device 1200 in operation S823. The second read command may instruct to read data from the memory bank 1220.

The memory device 1200 may read the second write data from the memory bank 1220 in operation S824. In detail, the memory device 1200 may read the second write data from the memory bank 1220 through the sense amplifier SA.

The memory device 1200 may provide the second write data, which has been read from the memory bank 1220, to the SoC 1100 in operation S825.

The SoC 1100 may calculate second data signal reference voltage (VREF_DQ2) configuration information based on the second write data received from the memory device 1200 and provide the VREF_DQ2 configuration information to the memory device 1200 in operation S826.

The memory device 1200 may adjust the level of the data signal reference voltage VREF_DQ, based on the VREF_DQ2 configuration information, in operation S827. For example, the memory device 1200 may adjust the level of the data signal reference voltage VREF_DQ to a second level. The second level may be different from the first level.

The SoC 1100 may adjust the phase of the write clock signal WCK and the phase of the data signal DQ, based on the second write data, in operation S828. In detail, the SoC 1100 may compare the second write data with the original second write data and adjust the phase difference between the write clock signal WCK and the data signal DQ, based on a result of the comparison. For example, the SoC 1100 may adjust the phase difference between the write clock signal WCK and the data signal DQ to a second phase value. The second phase value may be different from the first phase value.

Figure 9:
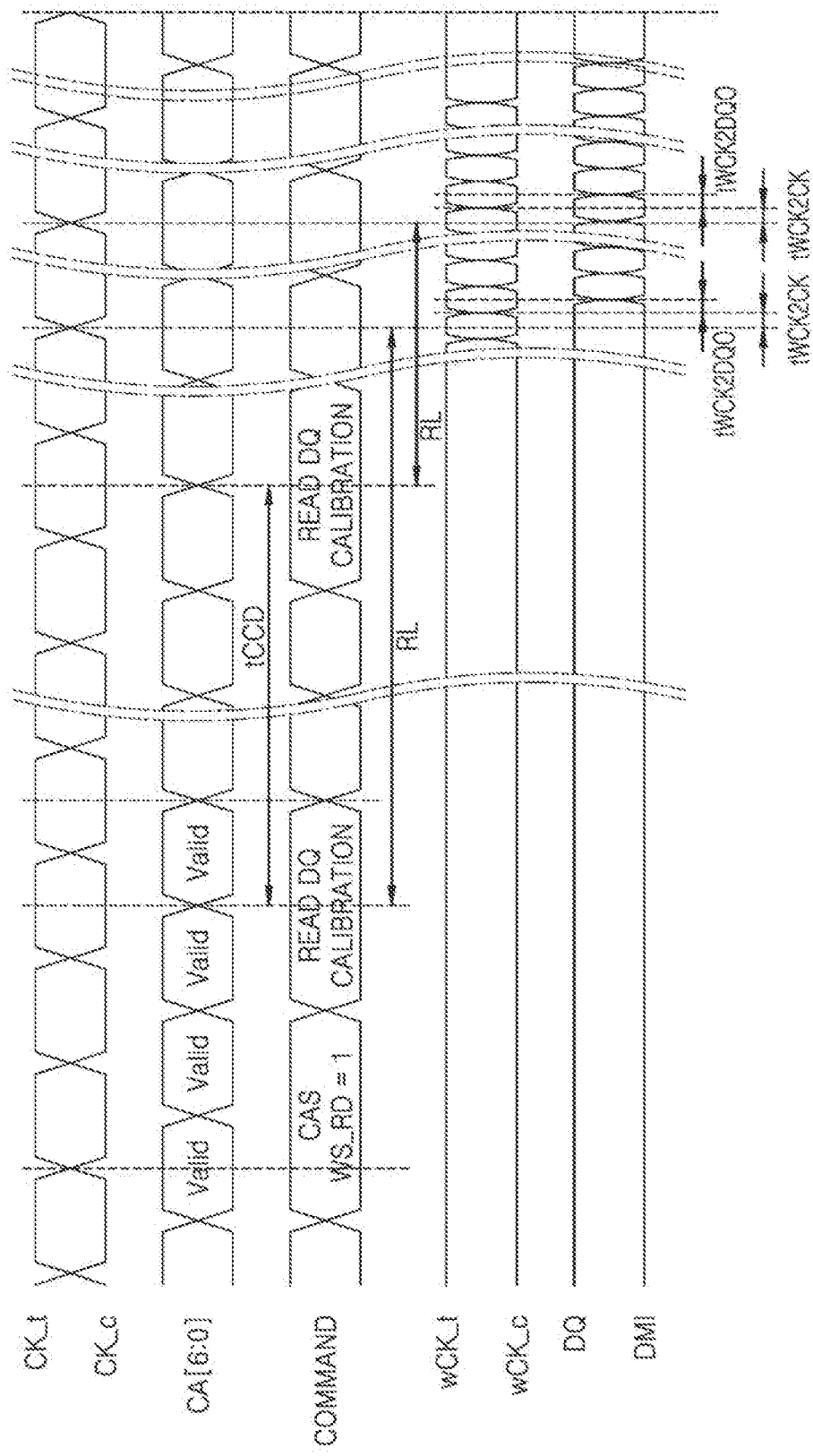
FIG. 9 is a timing diagram of signals transmitted between a memory device and an SoC during read training, according to some embodiments.

FIG. 9 is a timing diagram of signals transmitted between a memory device and an SoC during read training, according to some embodiments. FIG. 9 may be described with reference to FIGS. 4 and 5. The timing diagram of FIG. 9 may correspond to part of the first read training in FIG. 7.

Referring to FIG. 9, when the SoC 1100 transmits an RDC command to the memory device 1200 through the command/address signal CA, read training may start. Referring to FIG. 9, the command/address signal CA may be transmitted and received through six pins. Command "CAS WS_RD=1" may indicate that a read-related command is to be transmitted afterward. Clock signals CK_t and CK_c may be used to provide the command/address signal CA to the memory device 1200. The clock signals CK_t and CK_c may be complementary to each other.

After the RDC command is transmitted, read latency RL may elapse. The read latency RL may indicate the number of cycles of the clock signal CK_t or CK_c after the RDC command. After tWCK2CK and tWCK2DQO elapse, a pattern stored in the mode register circuit 1312 may be provided from the memory device 1200 to the SoC 1100 through the data signal DQ and a data mask inversion signal DMI. tWCK2CK may refer to a delay between write clock signals WCK_t and WCK_c and the clock signals CK_t and CK_c. tWCK2DQO may refer to a time, during which the data signal DQ is output from the memory device 1200 in response to the write clock signals WCK_t and WCK_c.

RDC commands may be provided from the SoC 1100 to the memory device 1200 at intervals of tCCD. tCCD may refer to the interval between RDC commands and may be determined according to the number of cycles of the clock signal CK_t or CK_c.

Figure 10:
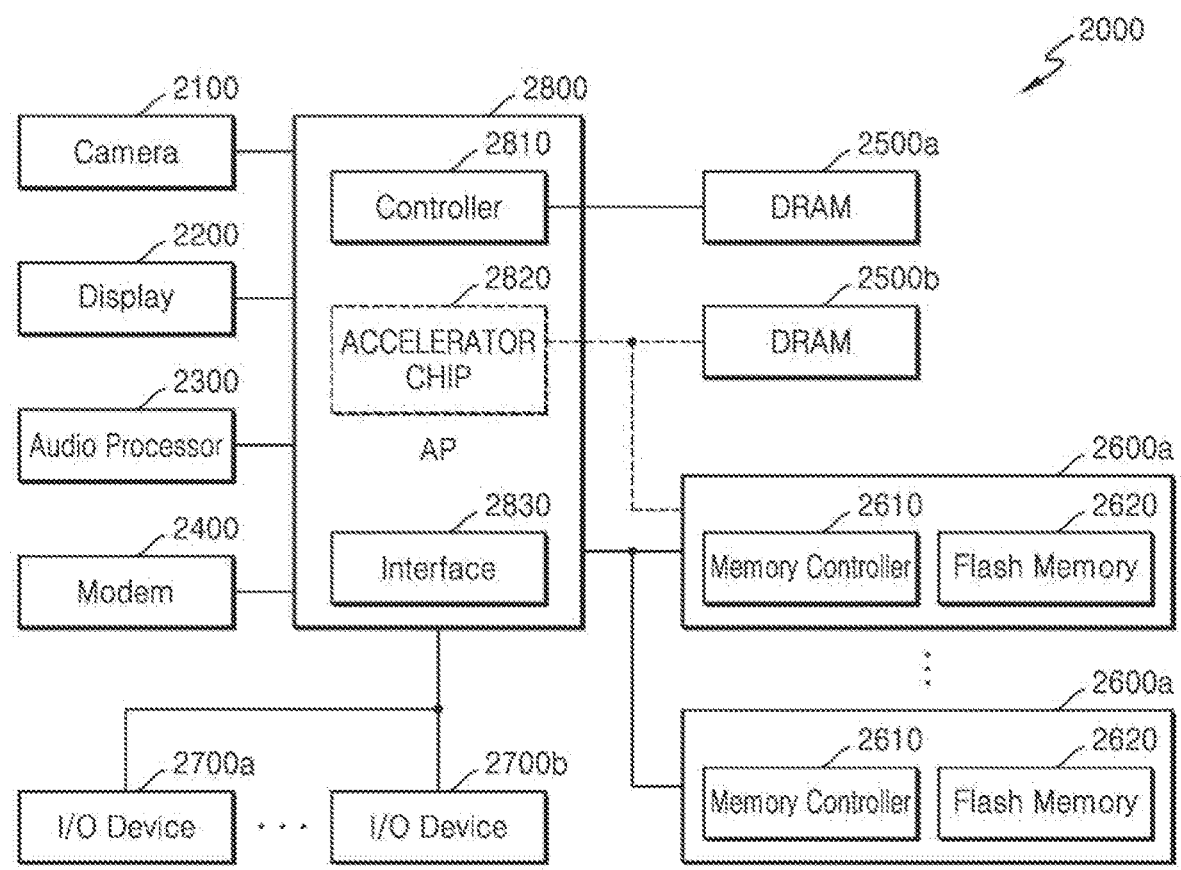
FIG. 10 is a block diagram of a system, to which an electronic device according to embodiments is applied.

FIG. 10 is a block diagram of a system 2000, to which an electronic device according to embodiments is applied.

Referring to FIG. 10, the system 2000 may include a camera 2100, a display 2200, an audio processor 2300, a modem 2400, DRAMs 2500a and 2500b, flash memory devices 2600a and 2600b, input/output (I/O) devices 2700a and 2700b, and an AP 2800. The system 2000 may be implemented as a laptop computer, a mobile phone, a smartphone, a table PC, a wearable device, a healthcare device, or an Internet of things (JOT) device. The system 2000 may be implemented as a server or a PC.

The camera 2100 may shoot a still image or a video under a user's control and store image/video data or transmit the image/video data to the display 2200. The audio processor 2300 may process audio data included in the contents of the flash memory devices 2600a and 2600b or a network. For wired/wireless data communication, the modem 2400 modulates a signal, transmits a modulated signal, and demodulates a received signal to restore an original signal. The I/O devices 2700a and 2700b may include devices, such as a universal serial bus (USB) storage, a digital camera, a secure digital (SD) card, a digital versatile disc (DVD), a network adapter, and a touch screen, which provide digital input and/or output functions.

The AP 2800 may generally control operations of the system 2000. The AP 2800 may control the display 2200 to display some of the contents stored in the flash memory devices 2600a and 2600b. When the AP 2800 receives user input through the I/O devices 2700a and 2700b, the AP 2800 may perform a control operation corresponding to the user input.

The AP 2800 may be provided as an SoC, which executes an application program, an OS, or the like. The AP 2800 and other elements of the system 2000, e.g., the DRAM 2500a, flash memory 2620, and/or a memory controller 2610, may be included in a single semiconductor package. For example, the AP 2800 and at least one other element may be provided as a package, such as a package-on-package (PoP), a ball grid array (BGA), a chip scale package (CSP), a system-in-package (SIP), a multi-chip package (MCP), a wafer-level fabricated package (WFP), or a wafer-level processed stack package (WSP).

The AP 2800 may include an accelerator block, which is a dedicated circuit for artificial intelligence (AI) data operations, or an accelerator chip 2820 may be provided separately from the AP 2800. The DRAM 2500b may be additionally mounted on the accelerator block or the accelerator chip 2820. An accelerator is a functional block that specially performs a certain function of the AP 2800 and may include a GPU that is a functional block specially performing graphics data processing, an NPU that is a functional block specially performing AI calculation and inference, and a data processing unit (DPU) that is a functional block specially performing data transmission. According to some embodiments, the system 2000 may include a plurality of DRAMs 2500a and 2500b. In some embodiments, the AP 2800 may include a controller 2810 controlling the DRAMs 2500a and 2500b, and the DRAM 2500a may be directly connected to the AP 2800. The AP 2800 may control the DRAMs 2500a and 2500b through commands and mode register setting (MRS), which comply with JEDEC standards, or may set a DRAM interface protocol and communicate with the DRAMs 2500a and 2500b to use company's unique functions, such as low voltage, high speed, and reliability, and a cyclic redundancy check (CRC) and/or error correction code (ECC) function. For example, the AP 2800 may communicate with the DRAM 2500a through an interface, such as LPDDR4 or LPDDR5, complying with the JEDEC standards, and the accelerator block or the accelerator chip 2820 may set a new DRAM interface protocol and communicate with the DRAM 2500b to control the DRAM 2500b, which has a higher bandwidth than the DRAM 2500a for an accelerator. In some embodiments, the AP 2800 may correspond to the SoC 1100 described above with reference to FIGS. 1 to 9. In some embodiments, each of the DRAMs 2500a and 2500b may correspond to the memory device 1200 described above with reference to FIGS. 1 to 9.

Although only the DRAMs 2500a and 2500b are illustrated in FIG. 10, embodiments are not limited thereto, and in some embodiments, any type of memory, such as PRAM, SRAM, MRAM, RRAM, FRAM, or hybrid RAM, which satisfies the requirements of a bandwidth, a response speed, and/or a voltage for the AP 2800 or the accelerator chip 2820, may be used. The DRAMs 2500a and 2500b have relatively less latency and bandwidth than the I/O devices 2700a and 2700b or the flash memory devices 2600a and 2600b. The DRAMs 2500a and 2500b may be initialized when the system 2000 is powered on and may be loaded with an OS and application data to be used as a temporary storage of the OS and the application data or may be used as a space for execution of various kinds of software code.

The four fundamental arithmetic operations, i.e., addition, subtraction, multiplication, and division, vector operations, address operation, or fast Fourier transform (FFT) operations may be performed in the DRAMs 2500a and 2500b. Functions for executions used for inference may also be performed in the DRAMs 2500a and 2500b. Here, the inference may be performed during a deep learning algorithm using an artificial neural network. The deep learning algorithm may include a training phase, in which a model is trained using various data, and an inference phase, in which data is recognized using the trained model. In some embodiments, an image shot by a user through the camera 2100 may undergo signal processing and may be stored in the DRAM 2500b, and the accelerator block or the accelerator chip 2820 may perform an AI data operation using data stored in the DRAM 2500b and a function used for inference to recognize the data.

In some embodiments, the AP 2800 may include an interface 2830, and accordingly, the flash memory devices 2600a and 2600b may be directly connected to the AP 2800 by the interface 2830. For example, the AP 2800 may be implemented as an SoC, the flash memory device 2600a may be implemented as a chip separate from the AP 2800, and the AP 2800 and the flash memory device 2600a may be mounted on a single package. However, embodiments are not limited thereto, and the flash memory devices 2600a and 2600b may be electrically connected to the system 1000 through a connection. Each of the flash memory devices 2600a and 2600b may include the flash memory 2620, which includes a non-volatile memory cell, and the memory controller 2610, which controls the flash memory 2620.

While various embodiments have been particularly shown and described with reference to the drawing figures, it will be understood that various changes in form and details may be made therein without departing from the spirit and scope of the following claims.

What is claimed is:

1. An operating method of an electronic device including a memory device and a system-on-chip (SoC) controlling the memory device, the operating method comprising:
    performing command bus training on a command/address line between the memory device and the SoC;
    performing first read training based on a first pattern that is stored in a mode register included in the memory device;
    performing first write training based on a first write operation on a buffer included in the memory device;
    performing second read training based on a second pattern that is stored in a memory bank included in the memory device; and
    performing second write training based on a second write operation on the memory bank.

2. The operating method of claim 1, wherein performing the first read training comprises adjusting, by the SoC, an SoC reference voltage to a first level, and
    performing the second read training comprises adjusting, by the SoC, the SoC reference voltage to a second level that is different from the first level.

3. The operating method of claim 2, wherein adjusting the SoC reference voltage to the first level comprises adjusting the SoC reference voltage to a level in a first voltage range,
    adjusting the SoC reference voltage to the second level comprises adjusting the SoC reference voltage to a level in a second voltage range, and
    the first voltage range is larger than the second voltage range.

4. The operating method of claim 1, wherein performing the first read training comprises adjusting, by the SoC, a phase difference between a data signal and a read strobe signal to a first phase value, the data signal and the read strobe signal being received from the memory device, and
    performing the second read training comprises adjusting, by the SoC, the phase difference between the data signal and the read strobe signal to a second phase value that is different from the first phase value.

5. The operating method of claim 1, wherein performing the second read training comprises:
    storing the first pattern that is read from the mode register in the memory bank as the second pattern; and
    performing the second read training based on the second pattern that is read from the memory bank.

6. The operating method of claim 1, wherein performing the first write training comprises adjusting a phase difference between a write clock signal and a data signal to a first phase value, based on the write operation on the buffer of the memory device,
    performing the second write training comprises adjusting the phase difference between the write clock signal and the data signal to a second phase value, based on the write operation on the memory bank of the memory device, and
    the first phase value is different from the second phase value.

7. The operating method of claim 1, wherein performing the first write training comprises adjusting, by the memory device, a data signal reference voltage to a first level, based on the write operation on the buffer of the memory device,
    performing the second write training comprises adjusting, by the memory device, the data signal reference voltage to a second level, based on the write operation on the memory bank of the memory device, and
    the first level is different from the second level.

8. The operating method of claim 7, wherein performing the first write training comprises:
    receiving, by the SoC from the memory device, first write data that is stored in the buffer;
    calculating, by the SoC, first reference voltage configuration information by comparing the first write data with first original data; and
    adjusting, by the memory device, a level of the data signal reference voltage to the first level, based on the first reference voltage configuration information, and
    performing the second write training comprises:
    receiving, by the SoC from the memory device, second write data that is stored in the memory bank;
    calculating, by the SoC, second reference voltage configuration information by comparing the second write data with second original data; and
    adjusting, by the memory device, the level of the data signal reference voltage to the second level, based on the second reference voltage configuration information.

9. An electronic device comprising:
    a system-on-chip (SoC) including a memory controller and a first interface circuit; and
    a memory device including a memory bank and a second interface circuit configured to exchange a signal with the first interface circuit and to control the memory bank, the memory bank including a plurality of memory cells,
    wherein the first interface circuit and the second interface circuit are configured to perform first read training based on a first read operation on the memory bank with respect to first read data and perform first write training based on write and read operations on the memory bank with respect to first write data.

10. The electronic device of claim 9, wherein the second interface circuit includes a buffer that stores data received from the first interface circuit, and
    the first interface circuit and the second interface circuit are further configured to perform second read training based on a second read operation on the buffer with respect to second read data and perform second write training based on write and read operations on the buffer with respect to second write data.

11. The electronic device of claim 10, wherein a first read training parameter with respect to the first read training is different from a second read training parameter with respect to the second read training, and a first write training parameter with respect to the first write training is different from a second write training parameter with respect to the second write training.

12. The electronic device of claim 9, wherein the first interface circuit is further configured to adjust a level of a reference voltage based on the first read data during the first read training, the reference voltage being used to capture the first read data.

13. The electronic device of claim 9, wherein the second interface circuit is further configured to, during the first read training, adjust a phase difference between a read strobe signal and a first data signal, based on the first read data, the read strobe signal and the first data signal being received from the second interface circuit.

14. The electronic device of claim 9, wherein the first interface circuit is further configured to, during the first write training, adjust a phase difference between a write clock signal and a data signal, based on the first write data, the write clock signal and the data signal being provided to the second interface circuit.

15. The electronic device of claim 9, wherein the first interface circuit is further configured to calculate first reference voltage configuration information during the first write training by comparing the first write data with original data, and the second interface circuit is further configured to adjust a level of a reference voltage based on the first reference voltage configuration information, the reference voltage being used to capture the first write data.

16. An operating method of a memory device controlled by a system-on-chip (SoC), the operating method comprising:

receiving a first write command and first write data from the SoC through a command/address line and a data line, respectively;

storing the first write data in a memory bank;

receiving a first read command from the SoC;

providing, to the SoC, the first write data that is stored in the memory bank;

receiving first data signal voltage configuration information from the SoC; and adjusting a level of a reference voltage to a first level, based on the first data signal voltage configuration information, the reference voltage being used to capture data received through the data line.

17. The operating method of claim 16, wherein adjusting the level of the reference voltage to the first level comprises:

storing the first data signal voltage configuration information in a mode register; and adjusting the level of the reference voltage, based on data stored in the mode register.

18. The operating method of claim 16, wherein storing the first write data in the memory bank comprises storing the first write data in the memory bank by using a write driver connected to a bit line of the memory bank.

19. The operating method of claim 18, wherein providing the first write data to the SoC comprises reading the first write data from the memory bank by using a sense amplifier connected to the bit line of the memory bank.

20. The operating method of claim 16, further comprising:

receiving a second write command and second write data from the SoC through the command/address line and the data line, respectively;

storing the second write data in a buffer;

receiving a second read command from the SoC;

providing, to the SoC, the second write data that is stored in the buffer;

receiving second data signal voltage configuration information from the SoC; and adjusting the level of the reference voltage to a second level, based on the second data signal voltage configuration information, wherein the first level is different from the second level.

* * * * *